United States Patent
Biagini et al.

(10) Patent No.: US 10,372,114 B2
(45) Date of Patent: Aug. 6, 2019

(54) QUANTIFYING AND REDUCING TOTAL MEASUREMENT UNCERTAINTY

(71) Applicant: KLA-Tencor Corporation, Milpitas, CA (US)

(72) Inventors: Karen Biagini, Watsonville, CA (US); Bryant Stanford Mantiply, Mountain View, CA (US); Ravichander Jayantha Rao, Bangalore (IN); Gary Taan, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 238 days.

(21) Appl. No.: 15/299,616

(22) Filed: Oct. 21, 2016

(65) Prior Publication Data
US 2018/0113441 A1  Apr. 26, 2018

(51) Int. Cl.
G05B 19/418 (2006.01)
H01L 21/67 (2006.01)
H01L 21/66 (2006.01)

(52) U.S. Cl.
CPC .... *G05B 19/4184* (2013.01); *H01L 21/67253* (2013.01); *H01L 21/67288* (2013.01); *G05B 2219/37525* (2013.01); *H01L 22/20* (2013.01); *Y02P 90/14* (2015.11); *Y02P 90/20* (2015.11)

(58) Field of Classification Search
CPC ...... G05B 19/4184; G05B 2219/37228; H01L 22/20; H01L 21/67253; H01L 21/67288
See application file for complete search history.

(56) References Cited

U.S. PATENT DOCUMENTS

| | | |
|---|---|---|
| 6,430,456 B1 | 8/2002 | Black et al. |
| 6,738,682 B1 | 5/2004 | Pasadyn |
| 7,065,425 B1* | 6/2006 | Kay ................ G05B 19/41875 700/110 |
| 7,107,177 B2 | 9/2006 | Sendelbach |
| 7,286,247 B2 | 10/2007 | Archie et al. |
| 7,848,911 B2 | 12/2010 | Plesant |
| 2003/0079121 A1 | 4/2003 | Gilman et al. |
| 2005/0197772 A1* | 9/2005 | Archie ................ G01B 21/045 702/1 |
| 2006/0195209 A1 | 8/2006 | Tseng et al. |
| 2007/0005172 A1 | 1/2007 | Malig et al. |

(Continued)

FOREIGN PATENT DOCUMENTS

| | | |
|---|---|---|
| WO | 2007109226 | 9/2007 |
| WO | 2015128866 | 9/2015 |

OTHER PUBLICATIONS

ISA/KR, International Search Report for PCT/US2017/057467 dated Jan. 29, 2018.

*Primary Examiner* — Kenneth M Lo
*Assistant Examiner* — David J Wynne
(74) *Attorney, Agent, or Firm* — Hodgson Russ LLP

(57) ABSTRACT

A process control technique uses production data from multiple manufacturing tools and multiple inspection or metrology tools. Total measurement uncertainty (TMU) can be calculated on the production data, which can include measurements of one or more devices manufactured using the manufacturing tools. Manufacturing steps can be ranked or otherwise compared by TMU. All production modes and recipes can be continually monitored using production data.

17 Claims, 8 Drawing Sheets

(56) References Cited

U.S. PATENT DOCUMENTS

| | | | |
|---|---|---|---|
| 2007/0050620 A1* | 3/2007 | Pham | G06F 21/6218 |
| | | | 713/165 |
| 2011/0060441 A1* | 3/2011 | Ko | G05B 17/02 |
| | | | 700/101 |
| 2012/0069337 A1 | 3/2012 | Ishigo | |
| 2013/0245806 A1* | 9/2013 | Vaid | H01L 22/20 |
| | | | 700/108 |
| 2016/0363872 A1* | 12/2016 | Sendelbach | H04B 17/309 |

* cited by examiner

Production Data Results for Thin Film Measurements
Measurement Step A

Hypothetical True Unknown Scenario

| | |
|---|---|
| True Total Variation | 7.14 |
| True Pure Process Std Deviation | 7 |
| True Tool-Tool Std Deviation | 1 |
| True Tool-Tool Precision | 1 |
| True %TMU Tool-Tool | 14% |
| True %TMU Precision | 14% |
| True %TMU Total | 20% |

Production unit measurements:

| Meas Tool | Sample Size, Number of production units | Average | Std Dev |
|---|---|---|---|
| 1 | 10 | 100.4 | 7.35 |
| 2 | 10 | 97.1 | 3.5 |
| 3 | 10 | 101.9 | 9.3 |
| Std Dev Tool-Tool | | 2.46 | 7.1 |
| Std Deviation of all raw data | | 7.55 | 2.2565645 |
| %TMU Tool-Tool, using simple std deviations | | | 33% |
| Sqrt(Variance Component (Tool-Tool)) | | 0.97 | |
| Sqrt(Variance Component (Total)) | | 7.20 | |
| %TMU Tool-Tool, using Variance Components | | | 13.4% |
| %TMU CLI Tool-Tool | | | 0.9% |

---

Production Data Results for Thin Film Measurements
Measurement Step B

Hypothetical True Unknown Scenario

| | |
|---|---|
| True Total Variation | 7.35 |
| True Pure Process Std Deviation | 7 |
| True Tool-Tool Std Deviation | 2 |
| True Tool-Tool Precision | 1 |
| True %TMU Tool-Tool | 14% |
| True %TMU Precision | 14% |
| True %TMU Total | 30% |

Production unit measurements:

| Meas Tool | Sample Size, Number of production units | Average | Std Dev |
|---|---|---|---|
| 1 | 100 | 100.9 | 7.25 |
| 2 | 100 | 98 | 5.8 |
| 3 | 100 | 102.1 | 7.8 |
| Std Dev Tool-Tool | | 2.11 | 7.0 |
| Std Deviation of all raw data | | 7.31 | 0.7001012 |
| %TMU Tool-Tool, using simple std deviations | | | 29% |
| Sqrt(Variance Component (Tool-Tool)) | | 1.99 | |
| Sqrt(Variance Component (Total)) | | 7.28 | |
| %TMU Tool-Tool, using Variance Components | | | 27.3% |
| %TMU CLI Tool-Tool | | | 3.8% |

FIG. 6

Reference Unit Measurements

Measurement Step B

In this example, the producer decides to have a measurement system monitor on only one measurement step to quantify precision. The measurement step with the highest %TMU Tool-Tool was chosen.

Reference unit measurements:

| Meas Tool | Sample Size, Number of repeated measurements of reference unit | Std Dev |
|---|---|---|
| 1 | 8 | 0.7 |
| 2 | 8 | 0.9 |
| 3 | 8 | 1.2 |
| | 0 | 1.0 RMS |
| | 0 | 7.31 |
| | 0 | 13% |

| | | |
|---|---|---|
| | 0 | 0.96 |
| Sqrt(Variance Component (Measurement System)) | | 2.21 |
| | 0.0% | 13.1% |
| | 0.0% | 30.3% |
| %TMU CLI, Total | | 4.7% |

FIG. 7

Production Data Results for Thin Film Measurements
Measurement Step C

Hypothetical True Unknown Scenario

| | |
|---|---|
| True Total Variation | 7.23 |
| True Pure Process Std Deviation | 7 |
| True Tool-Tool Std Deviation | 1.5 |
| True Tool-Tool Precision | 1 |
| True %TMU Tool-Tool | 14% |
| True %TMU Precision | 14% |
| True %TMU Total | 25% |

Production unit measurements:

| Meas Tool | Sample Size, Number of production units | Average | Std Dev |
|---|---|---|---|
| 1 | 50 | 100.7 | 7.25 |
| 2 | 50 | 98.4 | 5.8 |
| 3 | 50 | 101.9 | 7.8 |

| | | |
|---|---|---|
| Std Dev Tool-Tool | 1.78 | 7.0 |
| Std Deviation of all raw data | 7.22 | 0.9900926 |
| %TMU Tool-Tool, using simple std deviations | | 25% |
| Sqrt(Variance Component (Tool-Tool)) | 1.48 | |
| Sqrt(Variance Component (Total)) | 7.16 | |
| %TMU Tool-Tool, using Variance Components | | 20.6% |
| %TMU CLI Tool-Tool | | 2.2% |

Production Data Results for Thin Film Measurements
Measurement Step D

Hypothetical True Unknown Scenario

| | |
|---|---|
| True Total Variation | 7.14 |
| True Pure Process Std Deviation | 7 |
| True Tool-Tool Std Deviation | 1 |
| True Tool-Tool Precision | 1 |
| True %TMU Tool-Tool | 14% |
| True %TMU Precision | 14% |
| True %TMU Total | 20% |

Production unit measurements:

| Meas Tool | Sample Size, Number of production units | Average | Std Dev |
|---|---|---|---|
| 1 | 100 | 100.2 | 7.25 |
| 2 | 100 | 99.1 | 5.8 |
| 3 | 100 | 101.4 | 7.8 |

| | | |
|---|---|---|
| Std Dev Tool-Tool | 1.15 | 7.0 |
| Std Deviation of all raw data | 7.09 | 0.7001012 |
| %TMU Tool-Tool, using simple std deviations | | 16% |
| Sqrt(Variance Component (Tool-Tool)) | 0.91 | |
| Sqrt(Variance Component (Total)) | 7.06 | |
| %TMU Tool-Tool, using Variance Components | | 12.9% |
| %TMU CLI Tool-Tool | | 0.8% |

FIG. 8

QUANTIFYING AND REDUCING TOTAL MEASUREMENT UNCERTAINTY

FIELD OF THE DISCLOSURE

This disclosure relates to process control for manufacturing.

BACKGROUND OF THE DISCLOSURE

The quality of state-of-the-art products is becoming increasingly important as these products become a fundamental part of our modern, high tech economy. Manufacturers continue to focus on quality control and reproducibility to meet the demands of the high tech economy. Process control is used to produce the most consistent product properties in a manufacturing process. Quality control is essential in production lines where intricate or otherwise information-sensitive manufacturing is performed.

Poor quality control can drastically affect manufactured products. Improper or deficient process control can result in a product that is of reduced value or even useless to a user. Manufacturers are negatively impacted by poor process control because a manufacturer may pay manufacturing costs for a useless product, lose the opportunity to make a profit on an acceptable product, or lose revenue from a noncompliant product's reduced selling price. Thus, process control can affect whether the manufacturer's business survives or fails.

Manufacturing environments require measurement systems that have low overall total measurement uncertainty (TMU). Measurement uncertainty characterizes the dispersion of values attributed to a measured quantity. TMU can depend on the precision of the tool being used to take the measurements, as well as the tool-to-tool matching of the fleet of possible measurement tools.

In complicated manufacturing environments, many variables are in flux simultaneously. While a semiconductor environment is referred to herein, the principles are general to any manufacturing environment. For example, in a semiconductor manufacturing environment, variables like the process recipe, measurement tool recipe, overall process health, measurement tool health, and other parameters are all in flux. Providing a technique to monitor the measurement variation in a manufacturing facility to ensure variation is not getting worse over time can be valuable to a manufacturer. If a shift is detected, there can be a fast response to address the detected shift.

There are several existing methods to address the concerns of excessive measurement variation in a semiconductor manufacturing environment. However, semiconductor manufacturers and tool manufacturers are typically not in agreement with respect to optimal measurement system monitoring methods. Semiconductor manufacturers can use monitoring methods that meet manufacturing requirements for a measurement system and typically measure health of a measurement system using naturally-occurring production data. For example, all production manufacturing data can be used. Production wafer data is generally used instead of reference wafer data. Matching results can be measured continuously. Semiconductor manufacturer techniques can include boxplots, simple means and standard deviations from production, statistical test of production (e.g., analysis of variance (ANOVA), ttest), or statistical test of certain "golden wafers" or reference wafers (e.g., ANOVA, ttest). In contrast, tool manufacturers (which sell and/or service the equipment being used by the semiconductor manufacturer) tend to focus on clean experiments to separate measurement from process variation. These experiments may not generate increasing alarm percentages with production volume. The percent of matching-related alarms may not increase as precision improves, and vice-versa. Tool manufacturer techniques can include matching studies and a daily monitor of reference wafers against specifications. Thus, the monitoring methods of semiconductor manufacturers and tool manufacturers are not aligned.

Therefore, what is needed are improved process control techniques.

BRIEF SUMMARY OF THE DISCLOSURE

In a first embodiment, a system is provided. The system comprises an interface and a process control unit in electronic communication with the interface. The interface is in electronic communication with a plurality of manufacturing tools and a plurality of inspection or metrology tools. The process control unit is configured to receive production data from the plurality of manufacturing tools and the plurality of inspection or metrology tools; perform variance components analysis on the production data; calculate total measurement uncertainty (TMU) on the production data; and compare manufacturing steps by TMU. The production data includes measurements of one or more devices manufactured using the manufacturing tools. The variance components analysis is configured to estimate tool-to-tool standard deviation and total standard deviation. The process control unit comprises an electronic data storage unit configured to store a list of the manufacturing steps by TMU. The device may be a semiconductor wafer. The process control unit can include a processor and a communication port in electronic communication with the processor and the electronic data storage unit. The interface can be a secured server.

The process control unit can be further configured to calculate TMU control limit impact (CLI) on the production data and compare manufacturing steps by TMU CLI.

The process control unit can be further configured to adjust at least one of the manufacturing tools or at least one of the inspection or metrology tools based on the comparison of the manufacturing steps.

The process control unit can be further configured to: receive measurement data for a test vehicle from one of the manufacturing tools or one of the inspection or metrology tools; perform variance components analysis on the measurement data; calculate TMU for precision, total TMU, TMU CLI precision, and total TMU CLI; and compare results for the measurement data by TMU or TMU CLI. The variance components analysis can estimate standard deviation of precision. The process control unit can be further configured to adjust the manufacturing tool or the inspection tool based on the comparison of the results for the measurement data.

The process control unit can be configured to continuously perform the variance components analysis, calculate the TMU, and compare the manufacturing steps.

In a second embodiment, a method is provided. The method comprises receiving, at a processor, production data from a plurality of manufacturing tools and a plurality of inspection or metrology tools; performing, using the processor, variance components analysis on the production data; calculating, using the processor, total measurement uncertainty (TMU) on the production data; and comparing manufacturing steps by TMU using the processor. The production data includes measurements of one or more devices manufactured using the manufacturing tools. The variance components analysis estimates tool-to-tool standard deviation and total standard deviation. The device may be a semiconductor wafer.

The method can further comprise: calculating, using the processor, TMU control limit impact (CLI) on the production data; and comparing manufacturing steps by TMU CLI using the processor.

The method can further comprise adjusting at least one of the manufacturing tools or at least one of the inspection or metrology tools based on the comparing of the manufacturing steps.

The method can further comprise: receiving, at the processor, measurement data for a test vehicle from one of the manufacturing tools or one of the inspection or metrology tools; performing, using the processor, variance components analysis on the measurement data; calculating, using the processor, TMU for precision, total TMU, TMU CLI precision, and total TMU CLI; and comparing results for the measurement data by TMU or TMU CLI using the processor. The variance components analysis estimates standard deviation of precision. The method can further comprise adjusting the manufacturing tool or the inspection tool based on the comparing of the results for the measurement data.

The variance components analysis, calculating the TMU, and comparing the manufacturing steps can be performed continuously.

In a third embodiment, a non-transitory computer-readable storage medium is provided. The non-transitory computer-readable storage medium comprises one or more programs for executing the following steps on one or more computing devices. These steps include performing variance components analysis on production data from a plurality of manufacturing tools and a plurality of inspection or metrology tools; calculating total measurement uncertainty (TMU) on the production data; and comparing manufacturing steps by TMU. The production data includes measurements of one or more devices manufactured using the manufacturing tools. The variance components analysis estimates tool-to-tool standard deviation and total standard deviation.

The steps can further comprise calculating TMU control limit impact (CLI) on the production data and comparing manufacturing steps by TMU CLI.

The steps can further comprise: receiving measurement data for a test vehicle from one of the manufacturing tools or one of the inspection or metrology tools; performing variance components analysis on the measurement data; calculating TMU for precision, total TMU, TMU CLI precision, and total TMU CLI; and comparing results by TMU or TMU CLI for the measurement data. The variance components analysis can estimate standard deviation of precision.

The steps can further comprise adjusting one of the manufacturing tools or the inspection or metrology tools based on the comparing of the results.

DESCRIPTION OF THE DRAWINGS

For a fuller understanding of the nature and objects of the disclosure, reference should be made to the following detailed description taken in conjunction with the accompanying drawings, in which:

FIGS. 6-9 represent an example using an embodiment in accordance with the present disclosure.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Each of the steps of the method may be performed as described further herein. The methods may also include any other step(s) that can be performed by the process control unit and/or computer subsystem(s) or system(s) described herein. The steps are performed by one or more computer systems, which may be configured according to any of the embodiments described herein. In addition, the methods described above may be performed by any of the system embodiments described herein.

The embodiments disclosed herein are disclosed with respect to semiconductor manufacturing. However, the techniques disclosed herein can be applied to other manufacturing settings, including those for electronics, automobiles, chemicals, pharmaceuticals, aircraft, or biomedical devices.

Figure 3:
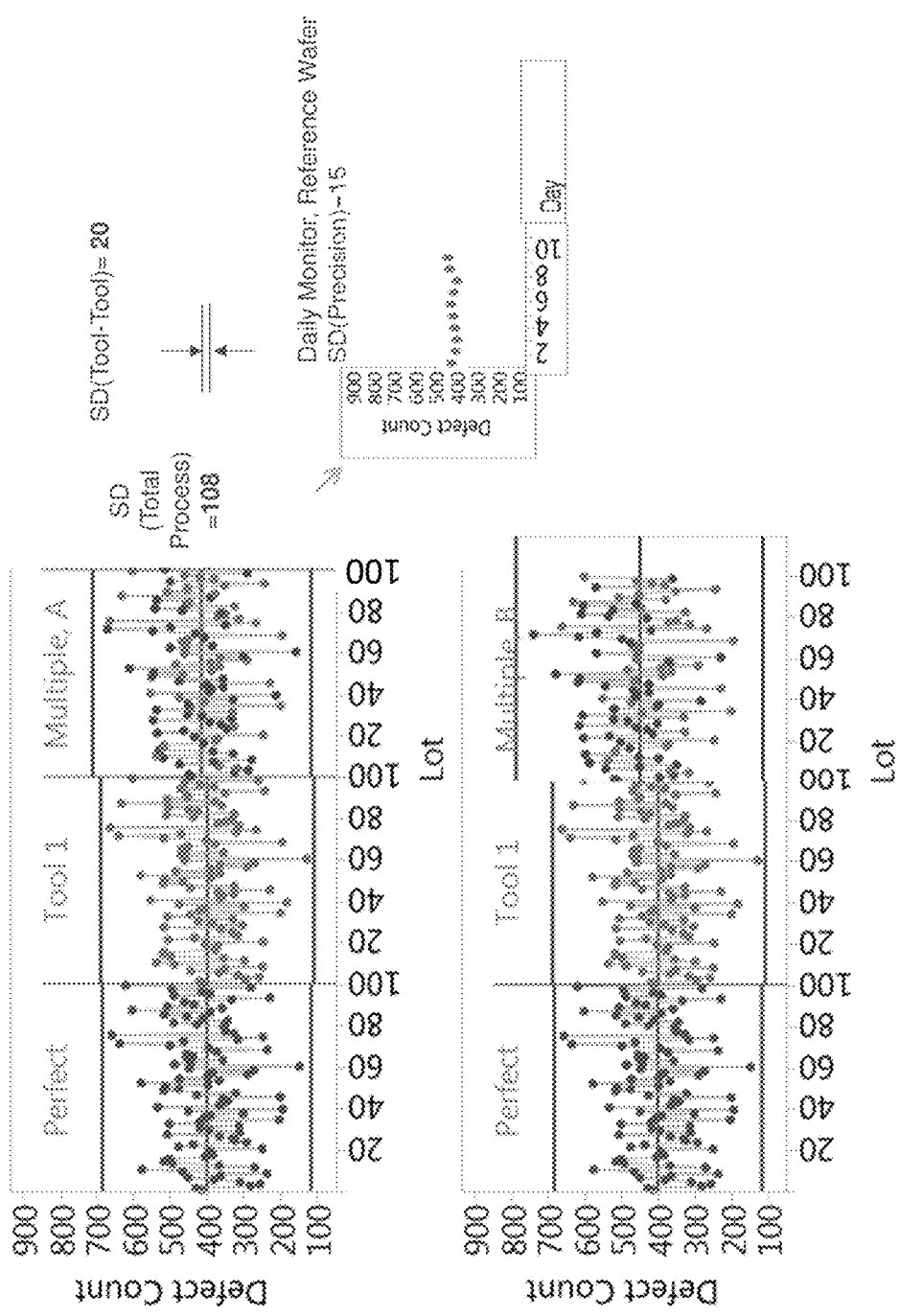
FIG. 3 represents an example of process control in semiconductor manufacturing.

An example is provided in FIG. 3. While the example of FIG. 3 pertains to semiconductor manufacturing, it can be applicable to other complex and/or exacting manufacturing environments. In FIG. 3, the semiconductor manufacturer desires a measurement tool with near-perfect standards. The best available tool (a first measurement tool) is installed. A second measurement tool is installed later. The semiconductor manufacturer desires that the first and second tool perform similarly, such as with respect to similar measurement means (i.e., tool-to-tool matching) and small within-tool measurement-induced variation (i.e., precision). However, the second measurement tool may have a shift in the means, causing a slight increase in the +/−3 sigma control limit width for the manufacturing tool production process (Multiple Tools, panel "A") or a larger shift in the means, causing a larger increase in the control limit width (Multiple Tools, panel "B"). An increase in control width reduces sensitivity for detecting a true process shift. With hundreds of possible tool and process step combinations to monitor, it can be difficult to quantify and prioritize these measurement system impacts.

A semiconductor manufacturer generally wants all measurement systems to be healthy across all measurement steps. The use of golden and silver test wafers is a common way to monitor within-tool and tool-to-tool measurement variation, but it consumes both resources and time. Instead, the semiconductor manufacturer generally wants continual production measurements and faster results than a test wafer.

However, the use of production measurements is prone to problems. A manufacturer may try to use a production monitor wherein a measurement step in the process has tool-to-tool variation larger than some fraction of the total standard deviation of the process variation seen on a production control chart, such as 0.1 or 0.3. This technique may disproportionately alarm on measurement steps which have smaller number of production units than other measurement steps. For example, five measurement steps all have the same level of true measurement tool-to-tool variation amongst the three interchangeable measurement tools used for that application, as seen in Equation 1.

$$\frac{\sigma(\mu(\text{tool 1}), \mu(\text{tool 2}), \mu(\text{tool 3}))}{\sigma(\text{total process})} \quad \text{Eq. 1}$$

The denominator in Equation 1 is the total process standard deviation on the production control chart, and the numerator is the true long term standard deviation ($\sigma$) in true tool means ($\mu$(tool i)) for infinite sample size. If the five measurement steps are similar in this way, but vary in sample size, with some measurement steps having lower and some having higher sample size, then the measurement steps that have a low number of process runs will tend to be implicated as the ones with the biggest apparent measurement sample deviation, "s," of the tool sample means, "m." On average, the sample variance of the tool means, $s^2$(m(tool 1), m(tool 2), m(tool 3)), is itself a random variable that depends not only on the true variation in tool means, but also on the within-tool sample size, N(within tool). Within-tool is referred to in the equations as "within tool" for clarity. In the case of constant sample size within-tool, the expected value of the sample variance, $s^2$, can be expressed as follows in Equation 2.

Expected Value [$s^2$(m(tool 1),m(tool 2),m(tool 3))]=$\sigma$
((μ(tool 1),μ(tool 2),μ(tool 3))$^2$+σ(within tool)$^2$/
N(within tool)=True standard deviation of tool
means+random sampling error            Eq. 2

The larger the sample size, the smaller the random sampling error. Conversely, the smaller the sample size, the more the random expected variance in the means, which is not caused by the measurement system itself, but is a mere side effect of random sampling variation. The TMU monitor disclosed herein is not pessimistic for small sample size or for large process sample size.

Another technique sometimes used with production measurements is a statistical p-value technique. In the previous example, the five measurement steps can be analyzed with a statistical test such as Analysis of Variance to test the hypothesis of equality of production means between the three measurement tools, the probability (or "p-value")<α, where α is typically 0.05, can be used as evidence of a systematic effect beyond random chance. This can determine whether there are detectable differences between tools, but does not help prioritize which measurement step has the largest problem. The recipe/measurement step combinations with the largest sample size will have the smallest p-values, all other factors being held constant. Attention will be drawn to those recipe/measurement step combinations as potential problems, even if these combinations are no worse (and perhaps even better) than other measurement steps for measurement tool variation. The TMU monitor disclosed herein can avoid the drawbacks of a statistical p-value technique and can provide a robust ranking of measurement system impact across measurement steps of varying sample size.

An ad hoc measurement repeatability study can be performed with one or more units under test, such as a silicon wafer or other product to be tested. A random effects analysis of variance can be conducted to produce a robust estimate of tool-to-tool and within-tool variation. Unbiased estimates of tool-to-tool and within-tool variability can be estimated. However, ad hoc experiments can be limited in scope of material. As material changes in a natural production environment, the sensitivity of measurement tools to this material also may change. Tool-to-tool measurement variation could get worse without detection because the product used for the test is no longer applicable and/or the tool conditions have changed. Ad hoc experiments generally cannot reflect subtle changes to product and tools over time. The TMU monitor disclosed herein can avoid the drawbacks of ad hoc testing because production data is used.

The TMU monitor disclosed herein is a robust indicator, capable of being used in semiconductor manufacturing environments or in other manufacturing environments. Production data is used to quantify tool measurement variation and to help find tool issues. Furthermore, a relative impact of measurements can be analyzed with a Pareto in a recipe-to-recipe manner.

Total Measurement Uncertainty will be referenced hereafter as either % TMU or simply TMU hereafter. Absolute TMU and % TMU can be defined as follows.

$$\text{Absolute } TMU = \sigma(\text{measurement}) = \sqrt{\sigma(\text{precision})^2 + \sigma(\text{tooltotool})^2} \quad \text{Eq. 3}$$

$$\% \ TMU = \frac{\sigma(\text{measurement})}{\sigma(\text{total process})} = \frac{\sqrt{\sigma(\text{precision})^2 + \sigma(\text{tool to tool})^2}}{\sigma(\text{total process})} \quad \text{Eq. 4}$$

In Equations 3 and 4 above, $\sigma$ is standard deviation. $\sigma$ can be generated using a variance components analysis technique.

% TMU may be favored over absolute TMU by a manufacturer because % TMU uses a normalized scale. Production data can be used to estimate the total standard deviation of measurement variation, $\sigma$(total process), using the standard deviation in a production control chart. Measurements taken on units produced for production are referred to as "production data," which are used to estimate the total variation in the process. These production data can be physical measurements (e.g., thickness, planarity), quality measurements (e.g., whether particles or defects are present), or other measurements taken during production. Total standard deviation of production data, $\sigma$(total process), can include both true process variation and measurement system variation, and is represented in variation visible in a production control chart. Production data is also used to estimate the standard deviation of true variation between measurement tool means, $\sigma$(tool to tool). Tool-to-tool is referred to as "tool to tool" in the equations for clarity. Instead of a simple observed standard deviation between tool averages, a random effects variance components analysis can be used to provide an unbiased estimate of the true standard deviation tool-to-tool, adjusting for the expected random sampling error. Thus, the disclosed techniques are robust to large and small sample size biases.

Further, the standard deviation of measurements of a single measurement tool on a single production unit over time, referred to as $\sigma$(precision), can be estimated using a test vehicle, such as a reference monitor. In semiconductor manufacturing, a reference monitor may be a reference wafer. In other industries, the reference monitor can be another device use for monitoring. Since it can be relatively expensive to run test wafers, and since $\sigma$(precision) may be a less impactful source of variation, the estimation of $\sigma$(precision) can be reduced to a small sample of measurement steps and the estimation of σ(tool to tool) can be performed on all production steps. An example is provided in FIGS. 6-9.

The Absolute TMU formula in Equation 3 expresses the total measurement variation in original units (e.g., Å, μm, defect counts, mm, etc.) or can be unitless (e.g., a percentage normalized across units), such as the % TMU in Equation 4. The unitless measure has the advantage of enabling comparisons across many layers, each with different process means and standard deviations, and can be used to determine which measurement step has the largest % TMU.

In the equations above, σ is standard deviation. σ can be generated using a robust variance components analysis technique. % TMU can be computed using only the tool-to-tool portion of measurement variation (% TMU(tool to tool)), or it can be computed with just the within-tool source of measurement variation (% TMU(precision)), or both (% TMU(total)). Note that σ(measurement) is the term that includes both the tool-to-tool and the within-tool measurement variation, as shown above.

The impact of measurement uncertainty on the control limit width can be expressed with a TMU control limit impact metric (TMU CLI) defined below in Equation 5.

$$TMU\ CLI = 1 - \frac{\sqrt{\sigma(\text{total process})^2 - \sigma(\text{measurement})^2}}{\sigma(\text{total process})} \quad \text{Eq. 5}$$

TMU CLI expresses the increase in a manufacturer's TMU process limits due to the TMU. For example, if σ(total process) is estimated as ten units and σ(measurement) is three units, then % TMU is 0.3 and TMU CLI is 0.046 or 4.6%. A 4.6% increase in process control limit width due to the total measurement uncertainty may exist. This can also be seen in FIG. 5.

TMU and TMU CLI can help describe a tool's impact on process control. Either can be used because both can provide similar ranking of measurement system relative variation across manufacturing steps. Thus, use of TMU and TMU CLI can address concerns of both manufacturers that desire a real time monitor and tool manufacturers that desire a method that does not overly alarm with sample size variation. % TMU and TMU CLI provide the additional benefit of measuring relative impact across manufacturing steps. Manufacturing measurements can include, for example, resistivity, flatness, thickness, contamination, uniformity, depth profile, etch selectivity, critical dimension, or other measurements. Generally, manufacturing measurements are a measurement taken in the manufacturing process.

FIGS. 6-9 show an example. There are four hypothetical measurement steps in FIGS. 6 and 8 that are measured in production for thickness of a film in a layer-by-layer deposition process. The "True" measurement contributions and their relative sizes for each are shown. Since not every unit is measured at every process step in production, unequal sample sizes at the four measurement steps may exist. Steps with lower sample sizes can have results with wider random process variation. This random process variation can cause the measurement tools to look more disparate, on average, than the measurement tools really are. If a correction is not applied, TMU based on simple observed standard deviation of the measurement tool means may over-estimate the true measurement uncertainty tool-to-tool. From this example, % TMU based on variance components provides a fair assessment that can match reality on average. However, if simple standard deviations are substituted into the % TMU formula, then, since simple standard deviations are affected by random sampling error as described earlier, the simple standard deviations will be biased on average, and will return incorrect rankings across measurement steps of variable sample sizes. Thus, the use of observed standard deviations without correction for random sampling variation may lead to incorrect conclusions with and across measurement steps.

Because it is relatively expensive, and because tool-to-tool variation is often a larger source of nuisance noise than precision variation, the use of a test vehicle can be used selectively. For example, a manufacturer may choose one or more measurement steps, per measurement tool type, to assess precision on a periodic basis. For measurement steps where both tool-to-tool and precision variation is measured, their total impact can be assessed.

In an embodiment, existing production data is analyzed for a time period. This time period may be every month, every week, or other time periods. Sources of variation are partitioned using a robust variance components analysis. Variance components are typically applied to experimental data. If monitoring across lots, then robustness of any outliers and, if relevant, small volumes may be addressed.

A TMU (e.g., % TMU) and/or TMU CLI can be calculated for each manufacturing step using the measurement tool type.

Ranking can be performed, which can drive improvements. Manufacturing steps with high TMU can be ranked for investigation. For example, improvements can be driven in TMU.

Figure 1:
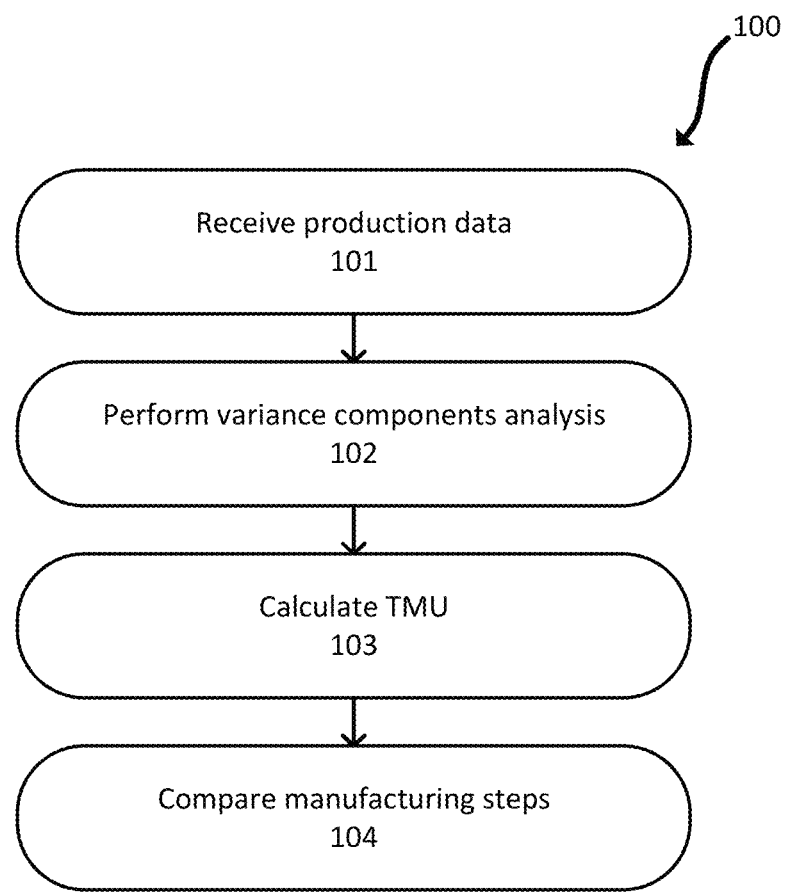
FIG. 1 is a flowchart of an embodiment of a process in accordance with the present disclosure.

FIG. 1 is a flowchart of an embodiment of a process 100. Production data is received 101. This production data can come from a plurality of manufacturing tools and/or a plurality of inspection or metrology tools. The production data can relate to a device manufactured using the manufacturing tools, such as a semiconductor wafer, that is reviewed in one of the inspection or metrology tools. For example, if film thickness is measured at ten steps in the manufacturing process using a set of equivalent film thickness measuring tools, then total production film thickness standard deviation can be partitioned into measurement tool-to-tool variation and within-tool variation for each step. To accomplish this analysis, variance components analysis is performed 102 on the production data. The variance components analysis estimates tool-to-tool standard deviation, total process standard deviation, or other standard deviations. TMU is calculated 103 on the production data. Manufacturing steps are compared 104 by TMU. For example, the manufacturing steps can be compared by TMU, such as by listing or ranking by TMU.

The method 100 can further include calculating TMU control limit impact (CLI) on the production data and ranking manufacturing steps by TMU CLI using the processor. Ranking can be used as a metric for prioritizing the corrective actions by impact to manufacturing. For instance, if ten manufacturing steps have film thickness measurements, and the film thickness measurement impact has been prioritized on those ten steps using % TMU (or TMU CLI), then the measurement steps with the largest % TMU can be investigated for possible improvements. The improvements may be ranked by which of these will provide the most benefit to overall process control to the manufacturer. The manufacturer may want a target under which the % TMU is at a desirable level, and above which the manufacturer wants to respond. Such a target may be by industry or may be use-case specific. In this manner, production measurements can be used to determine the measurement tool-to-tool relative impact, without requiring a test vehicle like a special reference wafer, and without having to be penalized for small or large sample size.

$$\% \, TMU \, \text{Tool to Tool} = \frac{\sigma(\text{tool to tool})}{\sigma(\text{total process})} \quad \text{Eq. 6}$$

$$TMU \, CLI \, \text{Tool to Tool} = \quad \text{Eq. 7}$$
$$1 - \frac{\sqrt{\sigma(\text{total process})^2 - \sigma(\text{tool to tool})^2}}{\sigma(\text{total process})}$$

$$\% \, TMU \, \text{Precision} = \frac{\sigma(\text{precision})}{\sigma(\text{total process})} \quad \text{Eq. 8}$$

Figure 4:
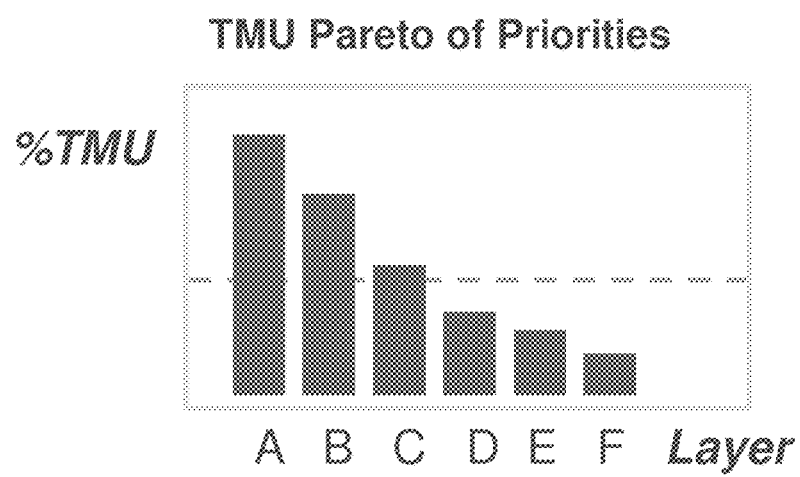
FIG. 4 is an exemplary Pareto of priorities by measurement step.
Figure 5:
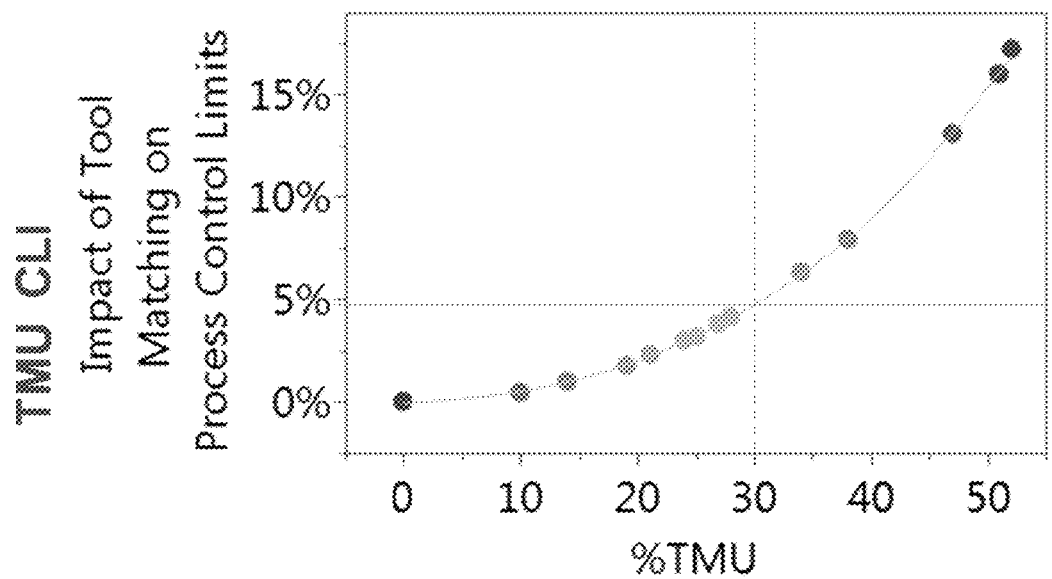
FIG. 5 is an exemplary chart showing TMU control limit impact.
Figure 9:
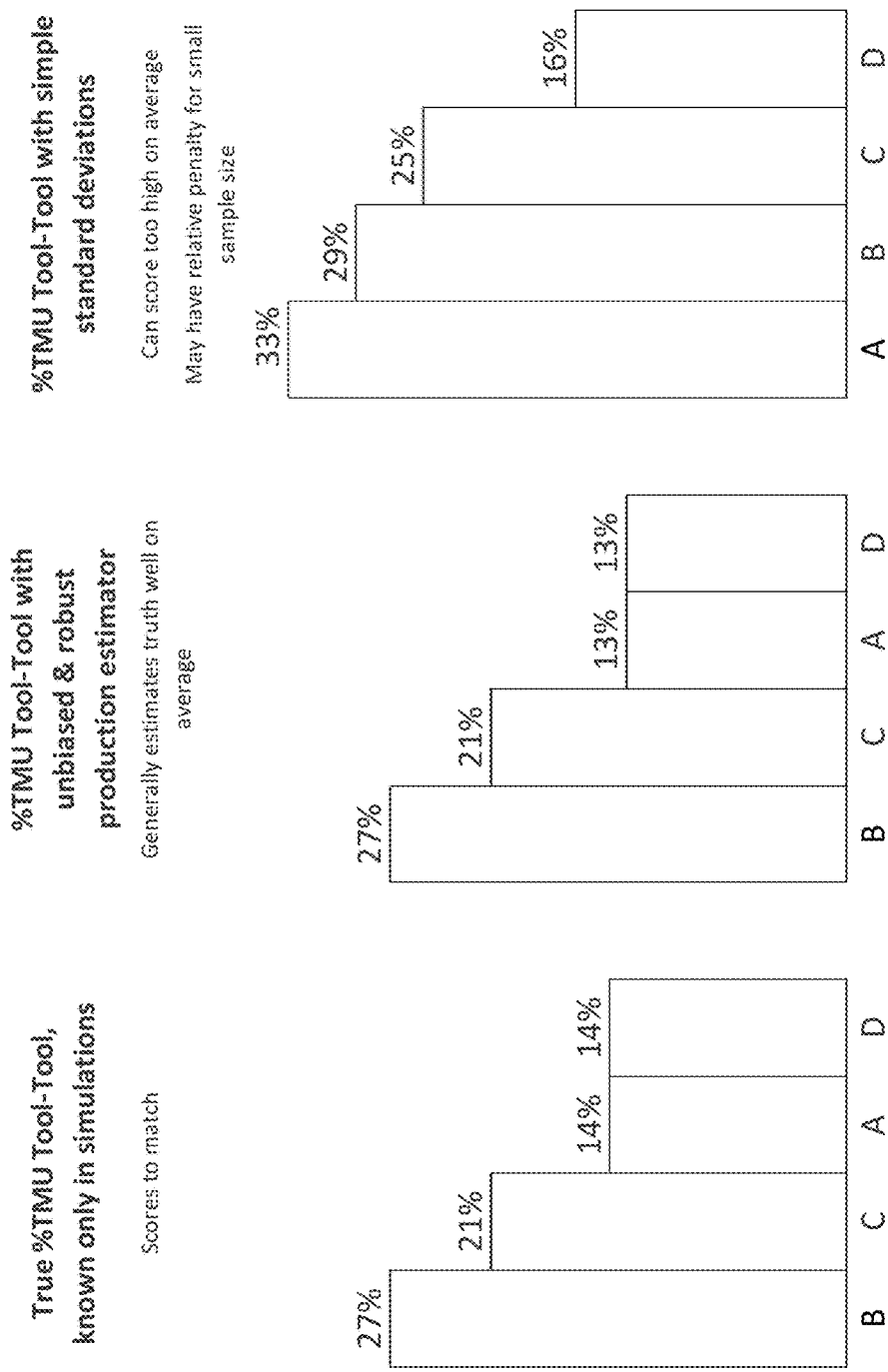

In another example, the precision or within-measurement-tool variation of a particular tool may be analyzed. Production measurements may not be used in this analysis because production measurements can confound process variation over time with measurement tool precision variation over time. The method 100 can include receiving measurement data on a test vehicle from a measurement tool, which can be performed as a regular monitor of the health of the measurement system, such as from an inspection or metrology step. A test vehicle, such as a reference wafer, may be used to obtain the measurement data. Variance components analysis can be performed to estimate standard deviation or precision. % TMU precision, TMU CLI precision, overall % TMU, and overall TMU CLI can be calculated. Results can be used to rank measurement steps by TMU or TMU CLI. For example, FIG. 4 shows an exemplary Pareto of prioritized improvements to various measurement steps. Adjusting the measurement steps with a higher TMU may provide the biggest improvement to overall process control of a manufacturing method. In another example, FIG. 5 shows an exemplary ranking by TMU CLI. Adjusting the measurement steps or tools with the higher TMU CLI may provide the biggest improvement to overall process control of a manufacturing method.

Based on the comparison (e.g., listing or ranking) of manufacturing steps by TMU with either production data or measurement data, one or more of the manufacturing tools and/or one or more of the inspection or metrology tools can be adjusted.

Figure 2:
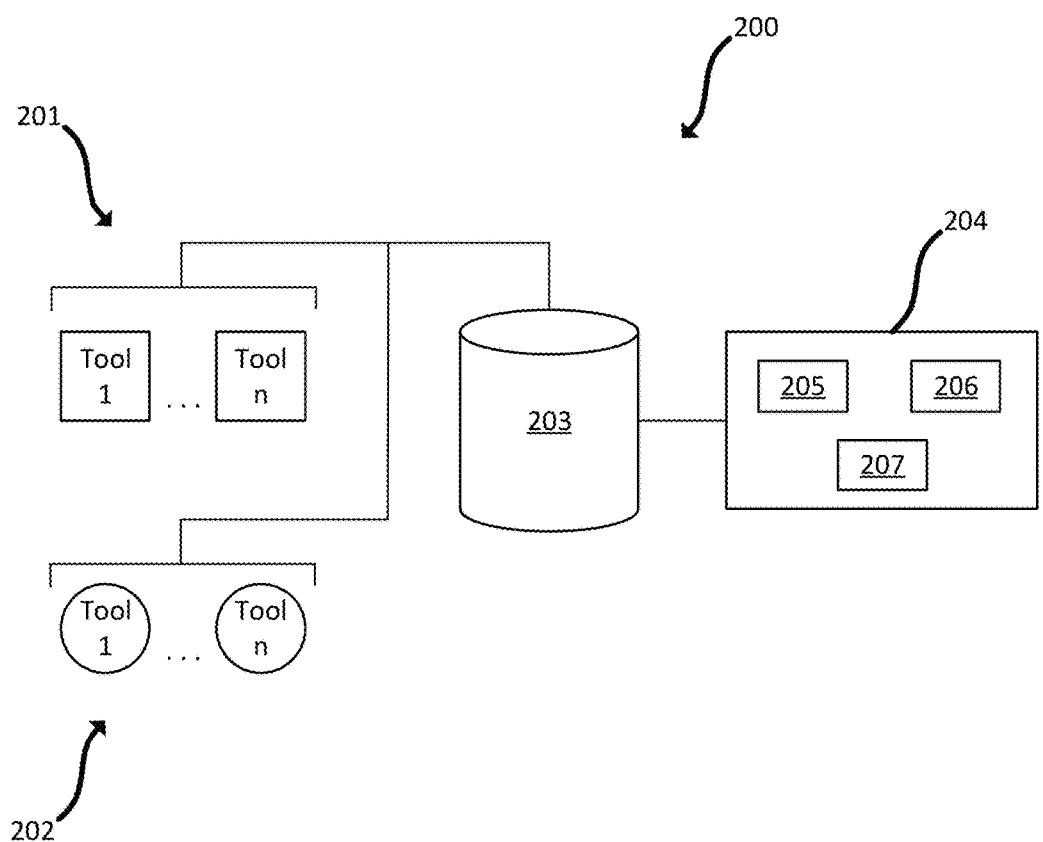
FIG. 2 is a block diagram of an embodiment of system integration in accordance with the present disclosure.

The steps of the method 100 can be performed using a processor, such as the processor 205 in FIG. 2. Variance components analysis, calculating the TMU, and comparing the TMU for the manufacturing steps can be performed continuously.

In a particular example, tool-to-tool process control is performed on a film thickness. Production data for all measurement steps related to the film thickness are analyzed. Robust variance components analysis can be used to separate tool-to-tool standard deviation from standard deviation. This analysis can indicate which of the measurement steps is most troublesome or has the most defects. A manufacturer may only be interested in monitoring and ranking measurement steps for measurement of a tool-to-tool matching component of TMU and % TMU tool-to-tool. This can be analyzed based on production data, and can be the most nuisance source of measurement variation in a measurement system. The manufacturer also may want to combine it with the precision component to get TMU. If precision is desired for a few steps, then a single production wafer may be retained and measured repeatedly using production methods and settings. This data can be used to regularly monitor TMU of the precision component. The precision and tool-to-tool components can be combined into an overall TMU this way.

Wafer data collection can be used to monitor precision at selected steps. For example, a daily test vehicle can be used. Robust variance component analysis can be performed. A standard deviation of precision can be estimated. The TMU of precision, TMU total, TMU CLI of precision, and TMU CLI total can be calculated. Since this kind of data collection requires a test vehicle and extra time, it may be reserved for a small number of measurement steps and may not be part of an overall ranking scheme.

FIG. 2 is a block diagram of an embodiment of system integration. The system 200 includes an interface 203 in electronic communication with a plurality of manufacturing tools 201 and a plurality of inspection or metrology tools 202. The interface 203 may be, for example, a secured server. The interface 203 is in electronic communication with a process control unit 204. The process control unit 204 can have a processor 205, a communication port 206 in electronic communication with the processor 205, and the electronic data storage unit 207 in electronic communication with the processor 205.

Examples of the manufacturing tools 201 include deposition tools, ion implantation tools, etching tools, lithography tools, or chemical mechanical polishing tools. Examples of inspection or metrology tools 202 include scanning electron microscopes, defect detection tools, defect review tools, film thickness measurement tools, surface profile measurement tools, resistivity measurement tools, overlay metrology, or critical dimension measurement tools. Other types of manufacturing tools and inspection or metrology tools are possible. For example, different manufacturing tools and inspection or metrology tools can be used if the manufactured devices are biomedical devices or electronics.

The process control unit 204 is configured to receive production data from the plurality of manufacturing tools 201 and the plurality of inspection or metrology tools 202, such as through the interface 203. The production data can relate to a device manufactured using the manufacturing tools 201. The device may be, for example, a semiconductor wafer. The process control unit 204 can be further configured to perform the steps of the method 100 of FIG. 1. The electronic data storage unit 207 can be configured to store a ranking of the manufacturing steps by TMU or other analyses.

The process control unit 204 can be configured to adjust at least one of the manufacturing tools 201 or at least one of the inspection or metrology tools 202 based on the comparison of the manufacturing steps. For example, a setting on a tool can be changed, the material input can be changed, a recipe can be changed, or a drift in a process can be addressed.

It is to be appreciated that the process control unit 204 may be implemented in practice by any combination of hardware, software, and firmware. Also, its functions as described herein may be performed by one unit, or divided up among different components, each of which may be implemented in turn by any combination of hardware, software and firmware. Program code or instructions for the process control unit 204 to implement the various methods and functions described herein may be stored in controller readable storage media, such as a memory in the electronic data storage unit 207, within the process control unit 204, external to the process control unit 204, or combinations thereof.

The process control unit 204 may be coupled to the components of the system 200 in any suitable manner (e.g., via one or more transmission media, which may include "wired" and/or "wireless" transmission media) such that the process control unit 204 can receive the output generated by the manufacturing tools 201 and/or inspection or metrology tools 202. The process control unit 204 may be configured to perform a number of functions using the output. For instance, the process control unit 204 may be configured to transmit or display results of analysis using the output. In another example, the process control unit 204 may be configured to send the output to an electronic data storage unit 207 or another storage medium without analyzing the output. The process control unit 204 may be further configured as described herein.

The process control unit 204, other system(s), or other subsystem(s) described herein may take various forms, including a personal computer system, image computer, mainframe computer system, workstation, network appliance, internet appliance, or other device. In general, the process control unit 204 may have one or more processors that execute instructions from a memory medium. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

An additional embodiment relates to a non-transitory computer-readable medium storing program instructions executable on a process control unit or other controller for performing a computer-implemented process control method, as disclosed herein. In particular, as shown in FIG. 2, electronic data storage unit 207 or other storage medium may contain non-transitory computer-readable medium that includes program instructions executable on the process control unit 204. The computer-implemented method may include any step(s) of any method(s) described herein.

Program instructions implementing methods such as those described herein may be stored on computer-readable medium, such as in the electronic data storage unit 207 or other storage medium. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

TMU can be used as a long-term health monitor to reflect the health of a measurement system instead of monitoring health ad-hoc using a stand-alone TMU experiment or occasional test wafer monitor measurements. For example, the process control unit can continuously monitor production data.

TMU can be normalized by statistical process control (SPC) chart total sigma to have a relative scale with which to prioritize opportunities for measurement system hardware and/or measurement recipe improvements. Higher % TMU on some measurement steps (such as 40%) can show a greater relative measurement tool standard deviation than lower % TMU (such as 10%).

Software can be used to generate a report that shows, for example, a rolling trend of TMU within-measurement step and a Pareto across measurement steps. This report can be by, for example, toolset and measurement step.

Feedback also can be provided to one or more tools based on the analysis. For high TMU measurement steps, a user can find possible hardware or software correlates to troubleshoot a problem.

A particular manufacturing tool and a particular inspection or metrology tool may be consistently used together. Chamber and tool usage may be randomized to prevent bias in the matching because dedicated tools can affect use of TMU. Taken in the extreme, if a process tool (A,B,C) is dedicated to a measurement tool (A,B,C) in a one-to-one fashion, then process tool variation will be perfectly confounded with measurement tool variation. When a random scheme is supported, then a measure of measurement tool health exists independent of manufacturing tool health. For this reason, TMU for dedicated systems may not be able to separate the various influences. However, TMU for dedicated systems may be still be used by manufacturers in certain situations.

Providing a standardized technique to monitor all measurement steps instead of just a few measurement steps provides benefits to semiconductor manufacturers or other manufacturers of complex products. Complex products can have multiple measurement steps. Defects in one measurement step can easily impact another measurement step. Monitoring all measurement steps can enable a better understanding of the entire manufacturing process.

The techniques disclosed herein use production manufacturing data to compute robust variance components analysis. This provides better results than a designed experiment because it reflects actual production conditions. The input data used in the analysis can be provided from any manufacturing tool. The analysis can be performed automatically and/or in real-time.

Use of % TMU and TMU CLI can focus on impact to actual process variation. Thus, work on measurement steps with low TMU will likely not lead to noticeable impact on a control chart. This can help a manufacturer be more efficient in address process control problems.

Use of TMU also provides a potential technique to support more aggressive recipes in production. Low capture rate recipes with an actual matching issue can be pinpointed. This can enable collaboration on real production data. This also can drive improvements with a full feedback loop to check a production result.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
   an interface in electronic communication with a plurality of manufacturing tools and a plurality of inspection or metrology tools; and a process control unit in electronic communication with the interface, wherein the process control unit is configured to:
  receive production data from the plurality of manufacturing tools and the plurality of inspection or metrology tools, wherein the production data includes measurements of one or more devices manufactured using the manufacturing tools;
  perform variance components analysis on the production data, wherein the variance components analysis is configured to estimate tool-to-tool standard deviation and total standard deviation;
  calculate total measurement uncertainty (TMU) on the production data;
  compare manufacturing steps by TMU;
  calculate TMU control limit impact (CLI) on the production data, wherein TMU CLI measures measurement uncertainty on control limit width based on total process standard deviation and measurement standard deviation;
  compare manufacturing steps by TMU CLI;
  determine a setting on at least one of the manufacturing tools or at least one of the inspection or metrology tools based on the comparison of the manufacturing steps by TMU and the comparison of the manufacturing steps by TMU CLI; and
  send instructions to adjust the setting on at least one of the manufacturing tools or at least one of the inspection or metrology tools based on the comparison of the manufacturing steps by TMU and the comparison of the manufacturing steps by TMU CLI; and
  wherein the process control unit comprises an electronic data storage unit configured to store a list of the manufacturing steps by TMU.

2. The system of claim 1, wherein the process control unit includes a processor and a communication port in electronic communication with the processor and the electronic data storage unit.

3. The system of claim 1, wherein the device is a semiconductor wafer.

4. The system of claim 1, wherein the process control unit is further configured to:
  receive measurement data for a test vehicle from one of the manufacturing tools or one of the inspection or metrology tools;
  perform variance components analysis on the measurement data, wherein the variance components analysis estimates standard deviation of precision;
  calculate TMU for precision, total TMU, TMU CLI precision, and total TMU CLI; and
  compare results for the measurement data by TMU or TMU CLI.

5. The system of claim 4, wherein the process control unit is further configured to adjust one of the manufacturing tools or one of the inspection or metrology tools based on the comparison of the results for the measurement data.

6. The system of claim 1, wherein the interface is a secured server.

7. The system of claim 1, wherein the process control unit is configured to continuously perform the variance components analysis, calculate the TMU, and compare the manufacturing steps.

8. The system of claim 1, wherein the process control unit is further configured to adjust the setting on at least one of the manufacturing tools or at least one of the inspection or metrology tools based on the comparison of the manufacturing steps by TMU and the comparison of the manufacturing steps by TMU CLI.

9. A method comprising:
  receiving, at a processor, production data from a plurality of manufacturing tools and a plurality of inspection or metrology tools, wherein the production data includes measurements of one or more devices manufactured using the manufacturing tools;
  performing, using the processor, variance components analysis on the production data, wherein the variance components analysis estimates tool-to-tool standard deviation and total standard deviation;
  calculating, using the processor, total measurement uncertainty (TMU) on the production data;
  comparing manufacturing steps by TMU using the processor;
  calculating, using the processor, TMU control limit impact (CLI) on the production data, wherein TMU CLI measures measurement uncertainty on control limit width based on total process standard deviation and measurement standard deviation;
  comparing manufacturing steps by TMU CLI using the processor;
  determining, using the processor, a setting on at least one of the manufacturing tools or at least one of the inspection or metrology tools based on the comparison of the manufacturing steps by TMU and the comparison of the manufacturing steps by TMU CLI; and
  sending instructions to adjust the setting on at least one of the manufacturing tools or at least one of the inspection or metrology tools using the processor based on comparing the manufacturing steps by TMU and based on comparing the manufacturing steps by TMU CLI.

10. The method of claim 9, wherein the device is a semiconductor wafer.

11. The method of claim 9, further comprising:
  receiving, at the processor, measurement data for a test vehicle from one of the manufacturing tools or one of the inspection or metrology tools;
  performing, using the processor, variance components analysis on the measurement data, wherein the variance components analysis estimates standard deviation of precision;
  calculating, using the processor, TMU for precision, total TMU, TMU CLI precision, and total TMU CLI; and
  comparing results for the measurement data by TMU or TMU CLI using the processor.

12. The method of claim 11, further comprising adjusting one of the manufacturing tools or one of the inspection or metrology tools based on the comparing of the results for the measurement data.

13. The method of claim 9, wherein performing the variance components analysis, calculating the TMU, and comparing the manufacturing steps are performed continuously.

14. The method of claim 9, further comprising adjusting the setting on at least one of the manufacturing tools or at least one of the inspection or metrology tools using the processor based on comparing the manufacturing steps by TMU and based on comparing the manufacturing steps by TMU CLI.

15. A non-transitory computer-readable storage medium, comprising one or more programs for executing the following steps on one or more computing devices:
  performing variance components analysis on production data from a plurality of manufacturing tools and a plurality of inspection or metrology tools, wherein the production data includes measurements of one or more devices manufactured using the manufacturing tools, and wherein the variance components analysis estimates tool-to-tool standard deviation and total standard deviation;

calculating total measurement uncertainty (TMU) on the production data;

comparing manufacturing steps by TMU;

calculating TMU control limit impact (CLI) on the production data, wherein TMU CLI measures measurement uncertainty on control limit width based on total process standard deviation and measurement standard deviation;

comparing manufacturing steps by TMU CU;

determining a setting on at least one of the manufacturing tools or at least one of the inspection or metrology tools based on the comparison of the manufacturing steps by TMU and the comparison of the manufacturing steps by TMU CLI; and sending instructions to adjust the setting on at least one of the manufacturing tools or at least one of the inspection or metrology tools based on comparing the manufacturing steps by TMU and based on comparing the manufacturing steps by TMU CLI.

16. The non-transitory computer-readable storage medium of claim 15, wherein the steps further comprise:

receiving measurement data for a test vehicle from one of the manufacturing tools or one of the inspection or metrology tools;

performing variance components analysis on the measurement data, wherein the variance components analysis estimates standard deviation of precision;

calculating TMU for precision, total TMU, TMU CLI precision, and total TMU CLI;

comparing results by TMU or TMU CLI for the measurement data; and sending instructions to adjust a setting on at least one of the manufacturing tools or at least one of the inspection or metrology tools based on comparing the results.

17. The non-transitory computer-readable storage medium of claim 15, wherein the steps further comprise adjusting the setting on at least one of the manufacturing tools or at least one of the inspection or metrology tools based on comparing the manufacturing steps by TMU and based on comparing the manufacturing steps by TMU CLI.

* * * * *